United States Patent
Mo et al.

(10) Patent No.: US 7,511,339 B2
(45) Date of Patent: *Mar. 31, 2009

(54) FIELD EFFECT TRANSISTOR AND METHOD OF ITS MANUFACTURE

(75) Inventors: Brian S. Mo, Fremont, CA (US); Duc Chau, San Jose, CA (US); Steven Sapp, Felton, CA (US); Izak Bencuya, Saratoga, CA (US); Dean E. Probst, West Jordan, UT (US)

(73) Assignee: Fairchild Semiconductor Corporation, South Portland, MA (US)

( * ) Notice: Subject to any disclaimer, the term of this patent is extended or adjusted under 35 U.S.C. 154(b) by 256 days.

This patent is subject to a terminal disclaimer.

(21) Appl. No.: 10/630,249

(22) Filed: Jul. 30, 2003

(65) Prior Publication Data
US 2004/0145015 A1    Jul. 29, 2004

Related U.S. Application Data

(63) Continuation of application No. 10/155,554, filed on May 24, 2002, now Pat. No. 6,710,406, which is a continuation of application No. 08/970,221, filed on Nov. 14, 1997, now Pat. No. 6,429,481.

(51) Int. Cl.
    *H01L 29/78* (2006.01)
(52) U.S. Cl. .................................................. 257/341
(58) Field of Classification Search ......... 257/229–341, 257/510–513
See application file for complete search history.

(56) References Cited

U.S. PATENT DOCUMENTS

| 4,070,690 A | 1/1978 | Wickstrom |
| 4,132,998 A | 1/1979 | Dingwall |
| 4,145,703 A | 3/1979 | Blanchard et al. |
| 4,326,332 A | 4/1982 | Kenney |
| 4,329,705 A | 5/1982 | Baker |

(Continued)

FOREIGN PATENT DOCUMENTS

CN    1090680 A    4/1994

(Continued)

OTHER PUBLICATIONS

Blanchard, R.A., "Optimization of discrete high power MOS transistors," *Stanford Electronics Laboratory, Integrated Circuits Laboratory*, Apr. 1982, Technical Report No. IDEZ696-2.

(Continued)

*Primary Examiner*—Nathan W Ha
(74) *Attorney, Agent, or Firm*—Townsend and Townsend and Crew LLP

(57) ABSTRACT

A trenched field effect transistor is provided that includes (a) a semiconductor substrate, (b) a trench extending a predetermined depth into the semiconductor substrate, (c) a pair of doped source junctions, positioned on opposite sides of the trench, (d) a doped heavy body positioned adjacent each source junction on the opposite side of the source junction from the trench, the deepest portion of the heavy body extending less deeply into said semiconductor substrate than the predetermined depth of the trench, and (e) a doped well surrounding the heavy body beneath the heavy body.

51 Claims, 9 Drawing Sheets

U.S. PATENT DOCUMENTS

| | | | |
|---|---|---|---|
| 4,333,227 A * | 6/1982 | Horng et al. | 438/359 |
| 4,344,081 A | 8/1982 | Pao et al. | |
| 4,345,265 A | 8/1982 | Blanchard | |
| 4,392,149 A * | 7/1983 | Horng et al. | 257/518 |
| 4,398,339 A | 8/1983 | Blanchard et al. | |
| 4,485,393 A * | 11/1984 | Kumamaru et al. | 257/536 |
| 4,503,449 A | 3/1985 | David et al. | |
| 4,503,598 A | 3/1985 | Vora et al. | |
| 4,541,001 A | 9/1985 | Schutten et al. | |
| 4,639,762 A | 1/1987 | Neilson et al. | |
| 4,682,405 A | 7/1987 | Blanchard et al. | |
| 4,683,643 A | 8/1987 | Nakajima et al. | |
| 4,767,722 A | 8/1988 | Blanchard | |
| 4,808,543 A | 2/1989 | Parrillo et al. | |
| 4,845,537 A | 7/1989 | Nishimura et al. | |
| 4,860,072 A | 8/1989 | Zommer | |
| 4,881,105 A | 11/1989 | Davari et al. | |
| 4,893,160 A | 1/1990 | Blanchard | |
| 4,914,058 A | 4/1990 | Blanchard | |
| 4,967,245 A | 10/1990 | Cogan et al. | |
| 4,974,059 A | 11/1990 | Kinzer | |
| 4,983,535 A | 1/1991 | Blanchard | |
| 5,016,068 A | 5/1991 | Mori | |
| 5,017,504 A | 5/1991 | Nishimura et al. | |
| 5,045,900 A | 9/1991 | Tamagawa | |
| 5,072,266 A | 12/1991 | Bulucea et al. | |
| 5,124,764 A | 6/1992 | Mori | |
| 5,160,491 A | 11/1992 | Mori | |
| 5,168,331 A | 12/1992 | Yilmaz | |
| 5,233,215 A | 8/1993 | Baliga | |
| 5,264,716 A * | 11/1993 | Kenney | 257/301 |
| 5,298,442 A | 3/1994 | Bulucea et al. | |
| 5,298,780 A | 3/1994 | Harada | |
| 5,316,959 A | 5/1994 | Kwan et al. | |
| 5,321,289 A | 6/1994 | Baba et al. | |
| 5,341,011 A | 8/1994 | Hshieh et al. | |
| 5,405,794 A | 4/1995 | Kim | |
| 5,410,170 A | 4/1995 | Bulucea et al. | |
| 5,430,324 A | 7/1995 | Bencuya | |
| 5,455,190 A | 10/1995 | Hsu | |
| 5,460,985 A | 10/1995 | Tokura et al. | |
| 5,468,982 A | 11/1995 | Hshieh et al. | |
| 5,474,943 A | 12/1995 | Hshieh et al. | |
| 5,508,534 A | 4/1996 | Nakamura et al. | |
| 5,532,179 A | 7/1996 | Chang et al. | |
| 5,541,425 A | 7/1996 | Nishihara | |
| 5,558,313 A | 9/1996 | Hshieh et al. | |
| 5,567,634 A | 10/1996 | Hebert et al. | |
| 5,578,851 A | 11/1996 | Hshieh et al. | |
| 5,592,005 A | 1/1997 | Floyd et al. | |
| 5,597,765 A | 1/1997 | Yilmaz et al. | |
| 5,602,046 A | 2/1997 | Calafut et al. | |
| 5,605,852 A | 2/1997 | Bencuya | |
| 5,614,751 A | 3/1997 | Yilmaz et al. | |
| 5,629,543 A | 5/1997 | Hshieh et al. | |
| 5,639,676 A | 6/1997 | Hshieh et al. | |
| 5,648,670 A | 7/1997 | Blanchard | |
| 5,656,843 A | 8/1997 | Goodyear et al. | |
| 5,661,322 A | 8/1997 | Williams et al. | |
| 5,665,619 A | 9/1997 | Kwan et al. | |
| 5,665,996 A | 9/1997 | Williams et al. | |
| 5,668,026 A | 9/1997 | Lin et al. | |
| 5,674,766 A | 10/1997 | Darwish et al. | |
| 5,688,725 A | 11/1997 | Darwish et al. | |
| 5,689,128 A | 11/1997 | Hshieh et al. | |
| 5,698,459 A * | 12/1997 | Grubisich et al. | 438/350 |
| 5,701,026 A | 12/1997 | Fujishima et al. | |
| 5,719,422 A * | 2/1998 | Burr et al. | 257/336 |
| 5,729,037 A | 3/1998 | Hshieh et al. | |
| 5,731,611 A | 3/1998 | Hshieh et al. | |
| 5,747,853 A | 5/1998 | So et al. | |
| 5,763,914 A | 6/1998 | Hshieh et al. | |
| 5,763,915 A | 6/1998 | Hshieh et al. | |
| 5,767,550 A | 6/1998 | Calafut et al. | |
| 5,767,567 A | 6/1998 | Hu et al. | |
| 5,776,812 A | 7/1998 | Takahashi et al. | |
| 5,780,324 A | 7/1998 | Tokura et al. | |
| 5,783,491 A | 7/1998 | Nakamura et al. | |
| 5,801,408 A | 9/1998 | Takahashi | |
| 5,814,858 A | 9/1998 | Williams | |
| 5,844,277 A | 12/1998 | Hshieh et al. | |
| 5,877,528 A | 3/1999 | So | |
| 5,877,529 A | 3/1999 | So et al. | |
| 5,879,971 A | 3/1999 | Witek | |
| 5,883,410 A | 3/1999 | So et al. | |
| 5,883,416 A | 3/1999 | Lin et al. | |
| 5,894,150 A | 4/1999 | Hshieh | |
| 5,895,951 A | 4/1999 | So et al. | |
| 5,895,952 A | 4/1999 | Darwish et al. | |
| 5,907,169 A | 5/1999 | Hshieh et al. | |
| 5,907,776 A | 5/1999 | Hshieh et al. | |
| 5,923,065 A | 7/1999 | So et al. | |
| 5,930,063 A | 7/1999 | Yoshihiro et al. | |
| 5,930,630 A | 7/1999 | Hshieh et al. | |
| 5,973,361 A | 10/1999 | Hshieh et al. | |
| 5,986,304 A | 11/1999 | Hshieh et al. | |
| 5,998,266 A | 12/1999 | So | |
| 5,998,836 A | 12/1999 | Williams | |
| 5,998,837 A | 12/1999 | Williams | |
| 6,005,271 A | 12/1999 | Hshieh | |
| 6,015,737 A | 1/2000 | Tokura et al. | |
| 6,020,827 A | 2/2000 | Konrad et al. | |
| 6,046,078 A | 4/2000 | So et al. | |
| 6,049,108 A | 4/2000 | Williams et al. | |
| 6,051,468 A | 4/2000 | Hshieh | |
| 6,104,060 A | 8/2000 | Hshieh et al. | |
| 6,165,826 A * | 12/2000 | Chau et al. | 438/231 |
| 6,172,398 B1 | 1/2001 | Hshieh | |
| 6,204,533 B1 | 3/2001 | Williams et al. | |
| 6,258,680 B1 * | 7/2001 | Fulford et al. | 438/305 |
| 6,281,547 B1 | 8/2001 | So et al. | |
| 6,404,025 B1 | 6/2002 | Hshieh et al. | |
| 2004/0140504 A1 * | 7/2004 | Hsu et al. | 257/341 |

FOREIGN PATENT DOCUMENTS

| | | |
|---|---|---|
| EP | 0 238 749 A2 | 9/1987 |
| EP | 0 550 770 B1 | 7/1993 |
| EP | 0 583 028 A1 | 2/1994 |
| EP | 0 698 919 A2 | 2/1996 |
| EP | 0720235 A2 | 3/1996 |
| EP | 0 720 235 A2 | 7/1996 |
| EP | 0 720 236 A2 | 7/1996 |
| EP | 0 746 030 A2 | 12/1996 |
| EP | 0 746 030 A3 | 12/1996 |
| EP | 0 755 076 A2 | 1/1997 |
| EP | 0 795 911 A2 | 9/1997 |
| EP | 0 801 425 A1 | 10/1997 |
| GB | 2269050 A | 1/1994 |
| JP | 56131960 A | 10/1981 |
| JP | 57018365 A | 1/1982 |
| JP | 57153469 A | 9/1982 |
| JP | 58137254 A | 8/1983 |
| JP | 58210678 A | 12/1983 |
| JP | 59080970 A | 5/1984 |
| JP | 59193064 A | 11/1984 |
| JP | 60028271 A | 2/1985 |
| JP | 61102782 A | 5/1986 |
| JP | 62012167 A | 1/1987 |
| JP | 62016572 A | 1/1987 |
| JP | 62023171 A | 1/1987 |
| JP | 62046569 A | 2/1987 |
| JP | 63114173 A | 5/1988 |
| JP | 05226661 A | 9/1993 |

| | | |
|---|---|---|
| JP | 07-66395 | 10/1995 |
| JP | 08-204194 A | 8/1996 |
| JP | 08204194 A | 8/1996 |
| JP | 08250731 A | 9/1996 |
| JP | 08316479 A | 11/1996 |
| JP | 09-036362 A | 2/1997 |
| JP | 09036362 A | 2/1997 |
| JP | 09102607 A | 4/1997 |
| JP | 09-270512 A | 10/1997 |
| JP | 09270512 A | 10/1997 |
| WO | WO 93/03502 A1 | 2/1993 |
| WO | WO 95/34094 A1 | 12/1995 |
| WO | WO 97/07547 | 2/1997 |
| WO | WO 97/07547 A1 | 2/1997 |
| WO | WO 97/16853 A1 | 5/1997 |

OTHER PUBLICATIONS

Chang, T.S. and Critchlow, D.L., "Verticle FET random-access memories with deep trench isolation," *IBM Technical Disclosure Bulletin*, Jan. 1980, pp. 3683-3687, vol. 22(8B).

Grant, D.A. and Gower, J., "The development of power MOS devices," Chapter 1.2 In *Power Mosfets: Theory and applications*. John Wiley & Sons; New York, 1989, pp. 5-23.

Goodenough, F., "Dense MOSFET enables portable power control," *Electronic Design* Apr. 14, 1997, pp. 45-50.

Holmes, F.E., and Salama, C.A.T., "V groove M.O.S. transistor technology," *Electronic Letters*, Sep. 20, 1973, pp. 457-458, vol. 9(19).

Lidow, A. et al., "Power Mosfet technology," *IEEE Technical Digest-Int. Electron Devices Meet*. 1979, pp. 79-83.

Lisiak, K.P. and Berger, J., "Optimization of nonplanar power MOS transistors," *IEEE Transactions on Electron Devices*, Oct. 1978, pp. 1229-1234, vol. Ed-25(10).

Ou-Yang, P., "Double ion implanted V-MOS technology," *IEEE Journal of Solid-State Circuits*, Feb. 1977, pp. 3-10, vol. SC-12(1).

Salama, C.A. and Oakes, J.G., "Nonplanar power field-effect transistors," *IEEE Transactions on Electron Devices*, Oct. 1978, pp. 1222-1228, vol. Ed-25(10).

Sun, S.C., "Physics and technology of power MOSFETs," *Stanford Electronics Laboratory, Integrated Circuits Laboratory*, Feb. 1982, Technical Report No. IDEZ696-1.

Sze, S.M., "P-N- Junction diode," Chapter 2 In *Physics of Semiconductor Devices*. Second Edition, John Wiley & Sons; New York, 1981, pp. 63-108.

Alpha & Omega Semiconductor Ltd. Complaint for Patent Infringement and Declaratory Judgment, Case No. C07-02638.

Alpha & Omega Semiconductor Ltd. First Amended Complain for Patent Infringement and Declaratory Judgment.

Fairchild Semiconductor Corp., Answer to Complain for Patent Infringement and Declaratory Judgment.

Fairchild Semiconductor Corp., Answer to First Amended Complaint for Patent Infringement and Declaratory Judgment.

Fairchild Semiconductor Corp., Complaint for Patent Infringement, Case No. C07-02664.

Fairchild Semiconductor Corp., Answer to Complaint for Patent Infringement and Declaratory Judgment; First Amended Counterclaims.

Alpha & Omega Semiconductor, Inc.'s Answer to Fairchild's Complain for Patent Infringement.

Alpha & Omega Semiconductor, Inc.'s and Alpha & Omega Semiconductor, Ltd.'s Reply and Affirmative Defenses to Fairchild's First Amended Counterclaims.

Alpha & Omega Semiconductor, Inc.'s and Alpha & Omega Semiconductor, Ltd.'s Replay to Fairchild's Second Amended Counterclaims.

Alpha & Omega Semiconductor, Ltd.'s Answer to Fairchild's Complaint for Patent Infringement.

Alpha & Omega Semiconductor, Inc.'s Reply and Affirmative Defenses to Fairchild's Counterclaims.

Alpha & Omega Semiconductor, Inc.'s Preliminary Invalidity Contentions.

Alpha & Omega Semiconductor, Inc.'s Supplemental Preliminary Invalidity Contentions.

Alpha & Omega Semiconductor, Inc.'s Second Supplemental Preliminary Invalidity Contentions.

Fairchild Semoconductor Corp.'s Opening Claim Construction Brief.

Declaration of Dr. Richard A. Blanchard in Support of Fairchild Semoconductor Corp.'s Opening Claim Construction Brief.

Declaration of Eric P. Jacobs in Support of Fairchild Semoconductor Corp.'s Opening Claim Construction Brief.

Alpha & Omega Semiconductor, Inc.'s Opposition Claim Construction Brief.

Declaration of Andre T. Salama in Support of Alpha & Omega Semiconductor, Inc.'s Opposition Claim Construction Brief.

Declaration of Yalei Sun in Support of Alpha & Omega Semiconductor, Inc.'s Opposition Claim Construction Brief.

Fairchild's Reply Claim Construction Brief.

Declaration of Dr. Richard A. Blanchard in Support of Fairchild's Reply Claim Construction Brief.

Declaration of Dr. Eric P. Jacobs in Support of Fairchild's Reply Claim Construction Brief.

Transcript of Markman Hearing.

AOS's Second Supplemental Preliminary Invalidity Contentions for U.S. Patent Nos. 6,429,481, 6,521,497, 6,710,406, 6,828,195, 7,148,111 and 6,818,947, Pursuant to Patent L.R. 3-3, 271 pages (May 30, 2008).

First Invalidation Brief submitted to the Taiwan Intellectual Property Office (TIPO) by Alpha & Omega Semiconductor of Hong Kong in an action regarding TIPO Application No. 87118857 (Sep. 2008).

Second Invalidation Brief submitted to the Taiwan Intellectual Property Office (TIPO) by Alpha & Omega Semiconductor of Hong Kong in an action regarding TIPO Application No. 87118857 (Sep. 2008).

* cited by examiner

FIELD EFFECT TRANSISTOR AND METHOD OF ITS MANUFACTURE

This application is a continuation of and claims the benefit of U.S. application Ser. No. 09/854,102 filed May 9, 2001, which is a divisional of U.S. application Ser. No. 08/970,221 filed Nov. 14, 1997.

BACKGROUND OF THE INVENTION

The present invention relates to field effect transistors, in particular trench DMOS transistors, and methods of their manufacture.

Power field effect transistors, e.g., MOSFETs (metal oxide semiconductor field effect transistors), are well known in the semiconductor industry. One type of MOSFET is a DMOS (double diffused metal oxide semiconductor) transistor. DMOS transistors typically include a substrate on which an epitaxial layer is grown, a doped source junction, a doped heavy body, a doped well of the same (p or n) doping as the heavy body, and a gate electrode. In trenched DMOS transistors the gate electrode is a vertical trench. The heavy body is typically diffused deeper than the bottom of the trench, to minimize electric field at the bottom corners of the trench and thereby prevent avalanche breakdown from damaging the device. The trench is filled with conductive polysilicon, and the polysilicon is generally overetched, to assure that it is completely removed from the surface surrounding the trench. This overetching generally leaves a recess between the top of the polysilicon and the surface of the semiconductor substrate (i.e., the surface of the epitaxial layer). The depth of this recess must be carefully controlled so that it is shallower than the depth of the source junctions. If the recess is deeper than the source junctions the source may miss the gate, resulting in high on-state resistance, high threshold, and potentially a non-functional transistor.

The source and drain junctions can be doped with either p-type or n-type dopants; in either case, the body will be doped with the opposite dopant, e.g., for n-type source and drain the body will be p-type. DMOS transistors in which the source and drain are doped with p-type carriers are referred to as "p-channel". In p-channel DMOS transistors a negative voltage applied to the transistor gate causes current flow from the source region, through a channel region of the body, an accumulation region of the epitaxial layer, and the substrate, to the drain region. Conversely, DMOS transistors, in which the source and drain are doped with n-type carriers, are referred to as "n-channel". In n-channel DMOS transistors a positive voltage applied to the transistor gate causes current to flow from drain to source.

It is desirable that DMOS transistors have low source to drain resistance ($Rds_{on}$) when turned on and low parasitic capacitance. The transistor structure should also avoid "punchthrough". Punchthrough occurs when, upon application of a high drain to source voltage, depletion into the body region extends to the source region, forming an undesirable conductive path through the body region when the transistor should be off. Finally, the transistor should have good "ruggedness", i.e., a high activation current is needed to turn on the parasitic transistor that inherently exists in DMOS transistors.

Generally a large number of MOSFET cells are connected in parallel forming a single transistor. The cells may be arranged in a "closed cell" configuration, in which the trenches are laid out in a grid pattern and the cells are enclosed on all sides by trench walls. Alternatively, the cells may be arranged in an "open cell" configuration, in which the trenches are laid out in a "stripe" pattern and the cells are only enclosed on two sides by trench walls. Electric field termination techniques are used to terminate junctions (doped regions) at the periphery (edges) of the silicon die on which the transistors are formed. This tends to cause the breakdown voltage to be higher than it would otherwise be if controlled only by the features of the active transistor cells in the central portions of the die.

SUMMARY OF THE INVENTION

The present invention provides field effect transistors that have an open cell layout that provides good uniformity and high cell density and that is readily scalable. Preferred trenched DMOS transistors exhibit low $Rds_{on}$, low parasitic capacitance, excellent reliability, resistance to avalanche breakdown degradation, and ruggedness. Preferred devices also include a field termination that enhances resistance to avalanche breakdown. The invention also features a method of making trench DMOS transistors.

In one aspect, the invention features a trenched field effect transistor that includes (a) a semiconductor substrate, (b) a trench extending a predetermined depth into the semiconductor substrate, (c) a pair of doped source junctions, positioned on opposite sides of the trench, (d) a doped heavy body positioned adjacent each source junction on the opposite side of the source junction from the trench, the deepest portion of the heavy body extending less deeply into said semiconductor substrate than the predetermined depth of the trench, and (e) a doped well surrounding the heavy body beneath the heavy body.

Preferred embodiments include one or more of the following features. The doped well has a substantially flat bottom. The depth of the heavy body region relative to the depths of the well and the trench is selected so that the peak electric field, when voltage is applied to the transistor, will be spaced from the trench. The doped well has a depth less than the predetermined depth of the trench. The trench has rounded top and bottom corners. There is an abrupt junction at the interface between the heavy body and the well, to cause the peak electric field, when voltage is applied to the transistor, to occur in the area of the interface.

In another aspect, the invention features an array of transistor cells. The array includes (a) a semiconductor substrate, (b) a plurality of gate-forming trenches arranged substantially parallel to each other and extending in a first direction, the space between adjacent trenches defining a contact area, each trench extending a predetermined depth into said substrate, the predetermined depth being substantially the same for all of said gate-forming trenches; (c) surrounding each trench, a pair of doped source junctions, positioned on opposite sides of the trench and extending along the length of the trench, (d) positioned between each pair of gate-forming trenches, a doped heavy body positioned adjacent each source junction, the deepest portion of each said heavy body extending less deeply into said semiconductor substrate than said predetermined depth of said trenches, (e) a doped well surrounding each heavy body beneath the heavy body; and (f) p+ and n+ contacts disposed at the surface of the semiconductor substrate and arranged in alternation along the length of the contact area.

Preferred embodiments include one or more of the following features. The doped well has a substantially flat bottom. The depth of each heavy body region relative to the depths of the wells and the gate-forming trenches is selected so that the peak electric field, when voltage is applied to the transistor, will be spaced from the trench. The doped wells have a depth less than the predetermined depth of the trenches. The trenches have rounded top and bottom corners. There is an abrupt junction at the interface between each heavy body and the corresponding well, to cause the peak electric field, when voltage is applied to the transistor, to occur in the area of the interface. The array also includes a field termination structure surrounding the periphery of the array. The field termination structure includes a well having a depth greater than that of the gate-forming trenches. The field termination structure includes a termination trench extending continuously around the periphery of the array, more preferably a plurality of concentrically arranged termination trenches.

In yet another aspect, the invention features a semiconductor die that includes (a) a plurality of DMOS transistor cells arranged in an array on a semiconductor substrate, each DMOS transistor cell including a gate-forming trench, each of said gate-forming trenches having a predetermined depth, the depth of all of the gate-forming trenches being substantially the same; and (b) surrounding the periphery of the array, a field termination structure that extends into the semiconductor substrate to a depth that is deeper than said predetermined depth of said gate-forming trenches.

Preferred embodiments include one or more of the following features. The field termination structure includes a doped well. The field termination structure includes a termination trench. The field termination structure includes a plurality of concentrically arranged termination trenches. Each of the DMOS transistor cells further comprises a doped heavy body and the doped heavy body extends into the semiconductor substrate to a depth than is less than the predetermined depth of the gate-forming trenches.

The invention also features a method of making a heavy body structure for a trenched DMOS transistor including (a) providing a semiconductor substrate; (b) implanting into a region of the substrate a first dopant at a first energy and dosage; and (c) subsequently implanting into said region a second dopant at a second energy and dosage, said second energy and dosage being relatively less than said first energy and dosage.

Preferred embodiments include one or more of the following features. The first and second dopants both comprise boron. The first energy is from about 150 to 200 keV. The first dosage is from about 1E15 to 5E15 $cm^{-2}$. The second energy is from about 20 to 40 keV. The second dosage is from about 1E14 to 1E15 $cm^{-1}$.

Additionally, the invention features a method of making a source for a trenched DMOS transistor including (a) providing a semiconductor substrate; (b) implanting into a region of the substrate a first dopant at a first energy and dosage; and (c) subsequently implanting into the region a second dopant at a second energy and dosage, the second energy and dosage being relatively less than the first energy and dosage.

Preferred embodiments include one or more of the following features. The first dopant comprises arsenic and the second dopant comprises phosphorus. The first energy is from about 80 to 120 keV. The first dosage is from about 5E15 to 1E16 $cm^{-2}$. The second energy is from about 40 to 70 keV. The second dosage is from about 1E15 to 5E15 $cm^{-2}$. The resulting depth of the source is from about 0.4 to 0.8 µm the finished DMOS transistor.

In another aspect, the invention features a method of manufacturing a trenched field effect transistor. The method includes (a) forming a field termination junction around the perimeter of a semiconductor substrate, (b) forming an epitaxial layer on the semiconductor substrate, (c) patterning and etching a plurality of trenches into the epitaxial layer; (d) depositing polysilicon to fill the trenches, (e) doping the polysilicon with a dopant of a first type, (f) patterning the substrate and implanting a dopant of a second, opposite type to form a plurality of wells interposed between adjacent trenches, (g) patterning the substrate and implanting a dopant of the second type to form a plurality of second dopant type contact areas and a plurality of heavy bodies positioned above the wells, each heavy body having an abrupt junction with the corresponding well, (h) patterning the substrate and implanting a dopant of the first type to provide source regions and first dopant type contact areas; and (i) applying a dielectric to the surface of the semiconductor substrate and patterning the dielectric to expose electrical contact areas.

Other features and advantages of the invention will be apparent from the following detailed description, and from the claims.

BRIEF DESCRIPTION OF THE DRAWINGS

In FIGS. 1a and 1b the source metal and dielectric layers are shown.

DESCRIPTION OF THE PREFERRED EMBODIMENTS

Figure 1:
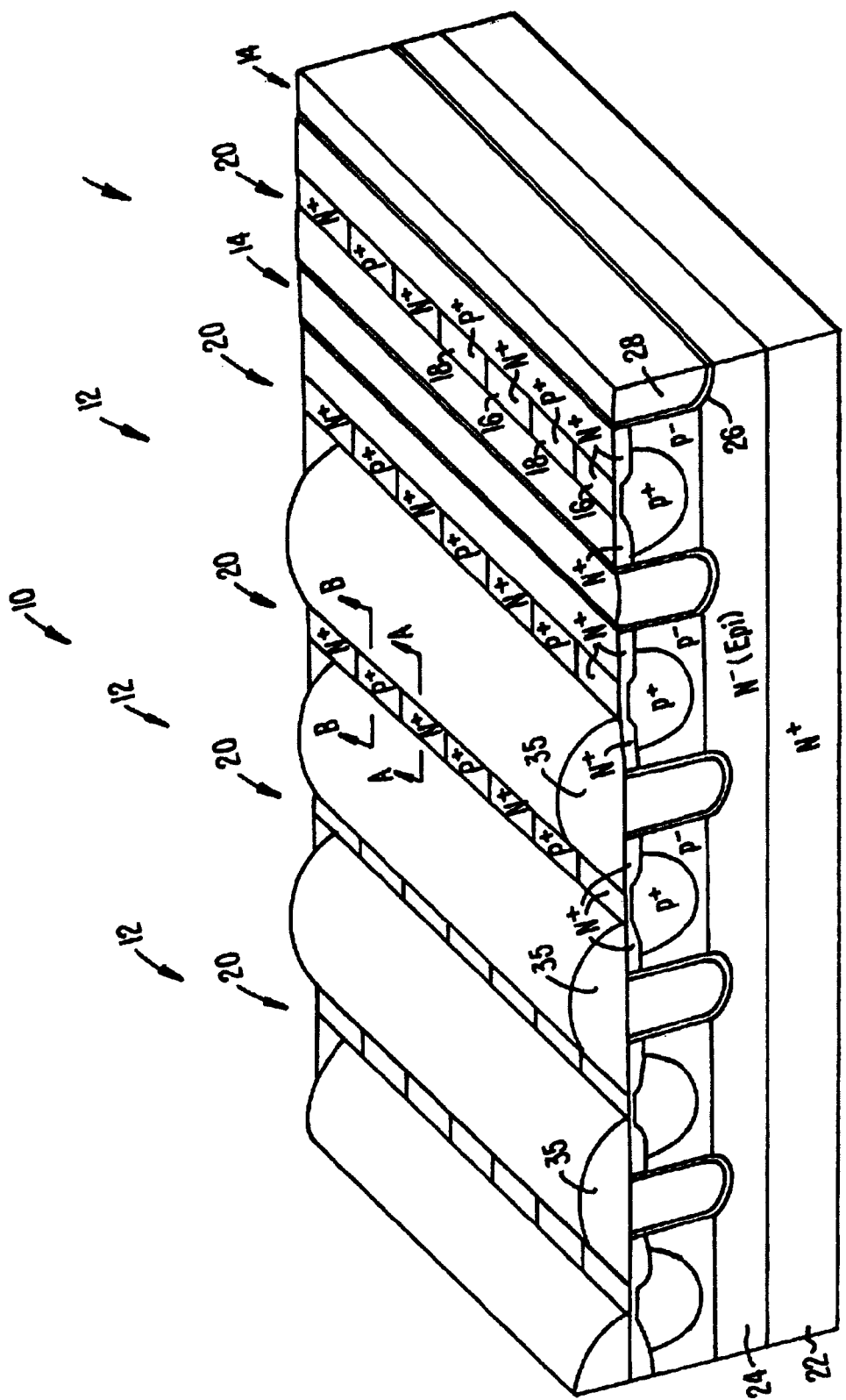
FIG. 1 is a highly enlarged, schematic perspective cross-sectional view showing a portion of a cell array including a plurality of DMOS transistors according to one aspect of the invention. The source metal layer and a portion of the dielectric layer have been omitted to show the underlying layers.

A cell array 10, including a plurality of rows 12 of trenched DMOS transistors, is shown in FIG. 1. Cell array 10 has an open cell configuration, i.e., trenches 14 run in only one direction, rather than forming a grid. Individual cells are formed by alternating n+ source contacts 16 and p+ contacts 18 in rows 20 that run parallel to and between trenches 14. The configuration of the regions of each row that have an n+ source contact are shown in cross-section in FIG. 1A, while the regions that have a p+ contact are shown in FIG. 1B.

Figure 1A:
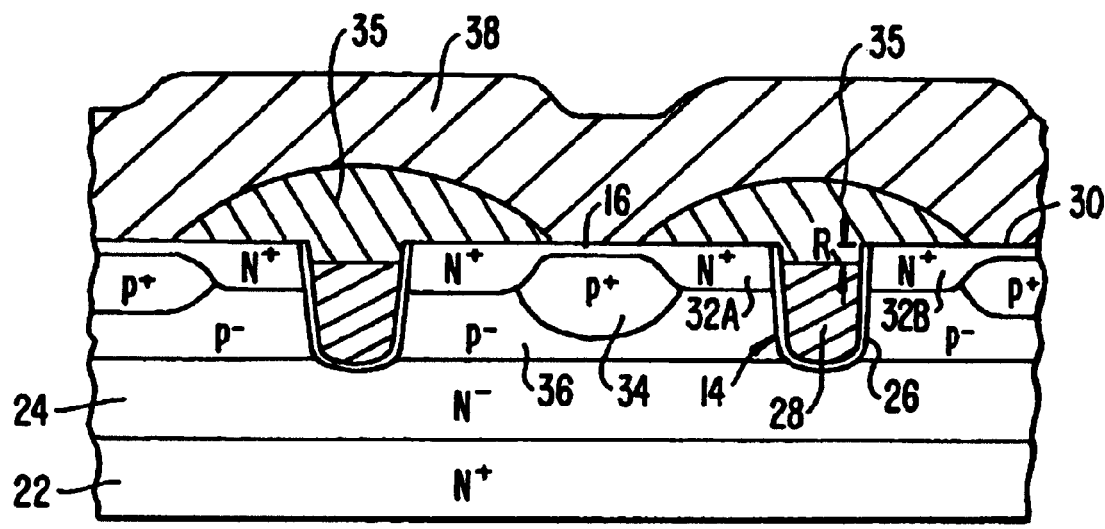
FIGS. 1a and 1b are side cross-sectional views of a single line of transistors from the array of FIG. 1, taken along lines A-A and B-B, respectively.
Figure 1B:
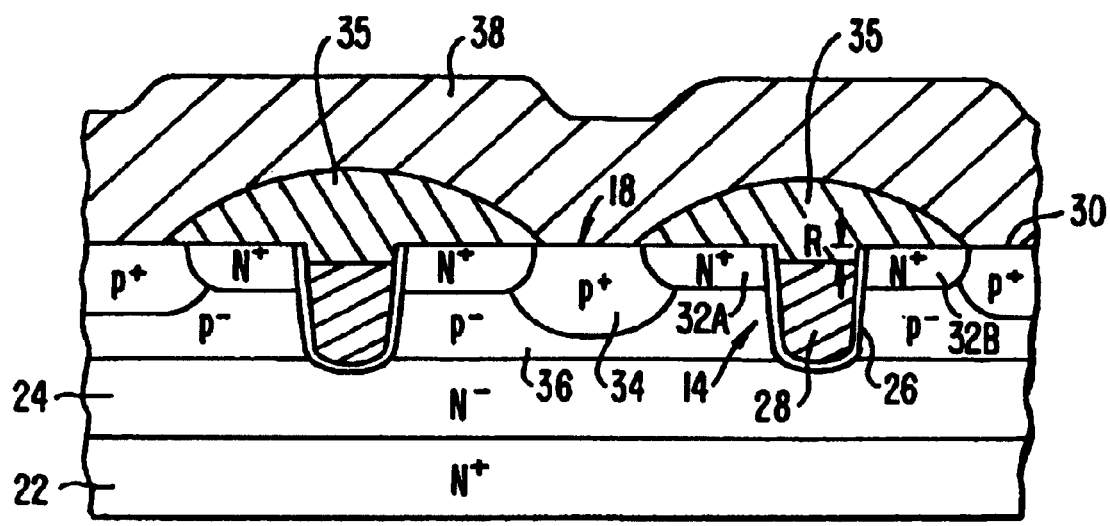

As shown in FIGS. 1A and 1B, each trenched DMOS transistor includes a doped n+ substrate (drain) layer 22, a more lightly doped n– epitaxial layer 24, and a gate electrode 28. Gate electrode 28 comprises a conductive polysilicon that fills a trench 14. A gate oxide 26 coats the walls of the trench and underlies the polysilicon. The top surface of the polysilicon is recessed from the surface 30 of the semiconductor substrate by a distance R (typically from about 0 to 0.4 µm). N+ doped source regions 32a, 32b are positioned one on each side of the trench 14. A dielectric layer 35 covers the trench opening and the two source regions 32a, 32b. Extending between the source regions of adjacent cells is a p+ heavy body region 34 and, beneath it, a flat-bottomed p− well 36. In the areas of the cell array which have a n+ contact 16, a shallow n+ doped contact region extends between the n+ source regions. A source metal layer 38 covers the surface of the cell array.

The transistor shown in FIGS. 1A and 1B includes several features that enhance the ruggedness of the transistor and its resistance to avalanche breakdown degradation.

First, the depth of the p+ heavy body region 34 relative to the depths of the trench 14 and the flat bottom of the p− well is selected so that the peak electric field when voltage is applied to the transistor will be approximately halfway between adjacent trenches. The preferred relative depths of the p+ heavy body, the p− well and the trench are different for different device layouts. However, preferred relative depths can be readily determined empirically (by observing the location of peak electric field) or by finite element analysis.

Second, the bottom corners of the trench 14 are rounded (preferably, the top corners are also rounded; this feature is not shown). Corner rounding can be achieved using the process described in U.S. application Ser. No. 08/959,197, filed on Oct. 28, 1997, now U.S. Pat. No. 6,103,635. The rounded corners of the trench also tend to cause the peak electric field to be moved away from the trench corners and towards a central location between adjacent trenches.

Third, an abrupt junction at the interface between the p+ heavy body and the p-well causes the peak electric field to occur in that area of the interface. Avalanche multiplication initiates at the location of the peak electric field, thus steering hot carriers away from the sensitive gate oxide and channel regions. As a result, this structure improves reliability and avalanche ruggedness without sacrificing cell density as much as a deeper heavy body junction. This abrupt junction can be achieved by the double doping process that will be described below, or by other processes for forming abrupt junctions, many of which are known in the semiconductor field.

Figure 2A:
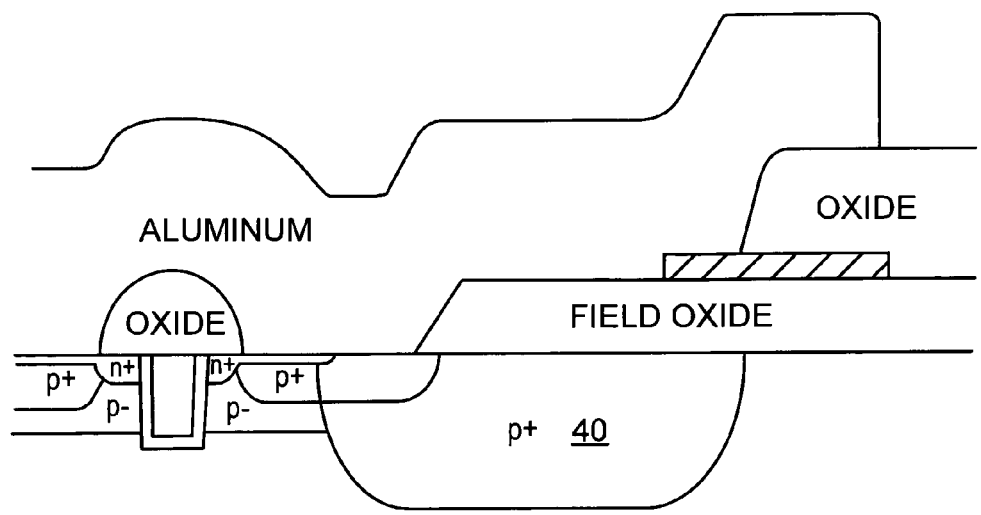
FIG. 2A is a highly enlarged schematic side cross-sectional view of a semiconductor die showing a portion of the cell array and the field termination.

Lastly, referring to FIG. 2, the cell array is surrounded by a field termination junction 40 which increases the breakdown voltage of the device and thaws avalanche current away from the cell array to the periphery of the die. Field termination junction 40 is a deep p+ well, preferably from about 1 to 3 μm deep at its deepest point, that is deeper than the p+ heavy body regions 34 in order to reduce the electric field caused by the junction curvature. A preferred process for making the above-described transistors is shown as a flow diagram in FIG. 3, and the individual steps are shown schematically in FIGS. 4-4K. It is noted that some steps that are conventional or do not require illustration are described below but not shown in FIGS. 4-4K. As indicated by the arrows in FIG. 3, and as will be discussed below, the order of the steps shown in FIGS. 4-4K can be varied. Moreover, some of the steps shown in FIGS. 4-4K are optional, as will be discussed.

A semiconductor substrate is initially provided. Preferably, the substrate is a N++ Si substrate, having a standard thickness, e.g., 500 μm, and a very low resistivity, e.g., 0.001 to 0.005 Ohm-cm. An epitaxial layer is deposited onto this substrate, as is well known, preferably to a thickness of from about 4 to 10 μm. Preferably the resistivity of the epitaxial layer is from about 0.1 to 3.0 Ohm-cm.

Figure 4:
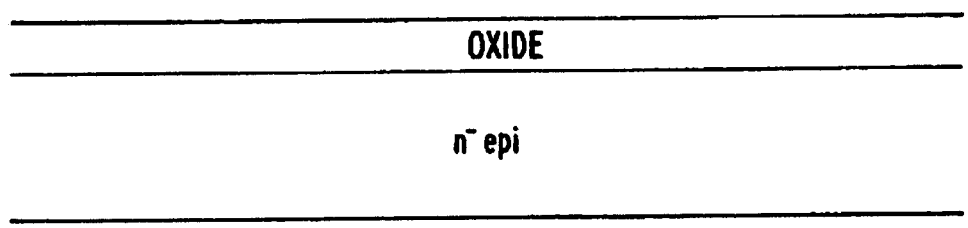
FIGS. 4-4K are schematic side cross-sectional views showing the individual steps of the process diagrammed in FIG. 3. The figure numbers for the detailed views in FIGS. 4-4K are shown parenthetically under the corresponding diagram boxes in FIG. 3.
Figure 4A:
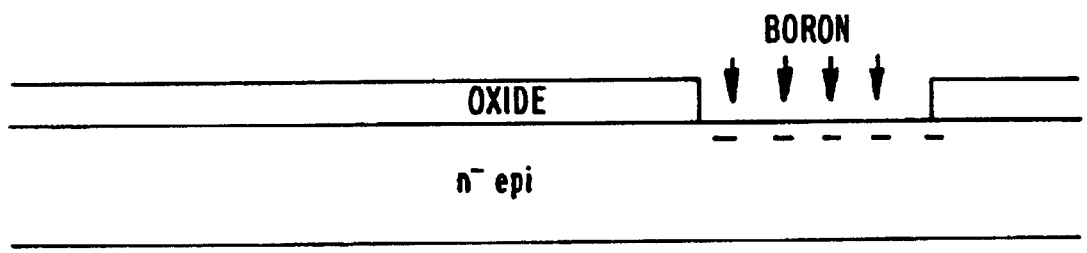
Figure 4B:
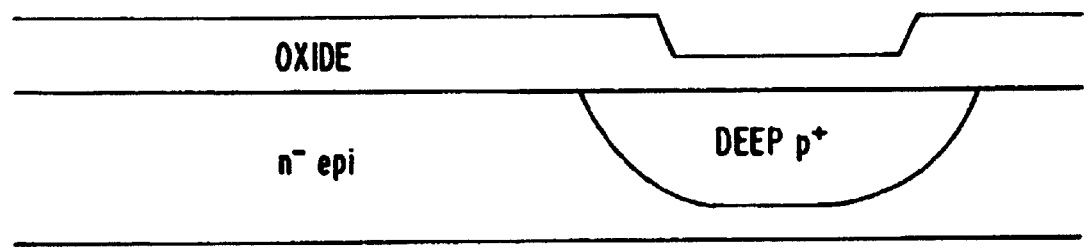
Figure 4C:
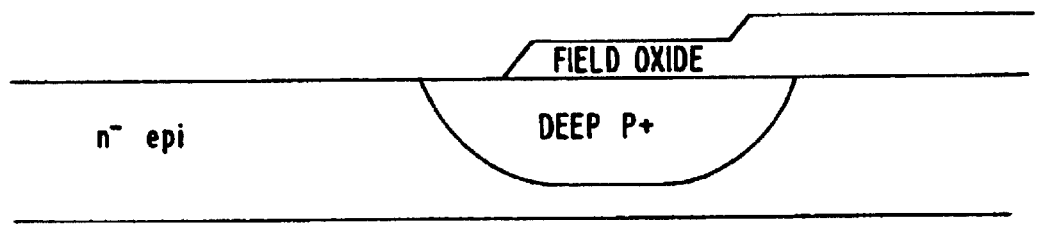

Next, the field termination junction 40 is formed by the steps shown in FIGS. 4-4C. In FIG. 4, an oxide layer is formed on the surface of the epitaxial layer. Preferably, the thickness of the oxide is from about 5 to 10 kÅ. Next, as shown in FIG. 4A, the oxide layer is patterned and etched to define a mask, and the p+ dopant is introduced to form the deep p+ well field termination. A suitable dopant is boron, implanted at an energy of from about 40 to 100 keV and a dose of 1E14 ($1 \times 10^{14}$) to 1E16 cm$^{-2}$. As shown in FIG. 4B, the p+ dopant is then driven further into the substrate, e.g., by diffusion, and a field oxide layer is formed over the p+ junction. Preferably the oxide thickness is from about 4 to 10 kÅ. Finally, the oxide (FIG. 4) over the active area of the substrate (the area where the cell array will be formed) is patterned and removed by any suitable etching process, leaving only the field oxide in suitable areas. This leaves the substrate ready for the following steps that will form the cell array.

Figure 2B:
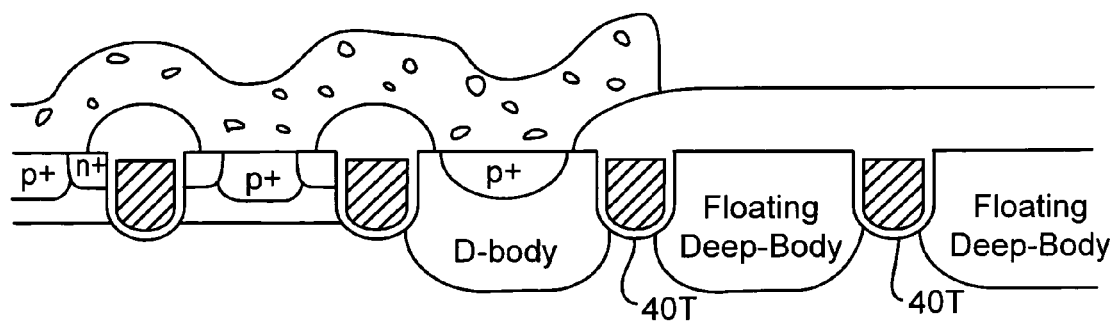
FIG. 2B is a cross-sectional view of another embodiment of a semiconductor die showing a portion of the cell array and the field termination.

It is noted that, as an alternative to steps 4-4C, a suitable field termination structure can be formed using a ring-shaped trench which surrounds the periphery of the cell array and acts to lessen the electric field and increase the resistance to avalanche breakdown degradation. This trench field termination does not require a field oxide or deep p+ body junction to be effective. Consequently, it can be used to reduce the number of process steps. Using a trench ring (or multiple concentric trench rings) to form a field termination is described in, e.g., U.S. Pat. No. 5,430,324, the full disclosure of which is hereby incorporated herein by reference. Preferably, the trench would have substantially the same depth as the trenches in the cell array. An exemplary embodiment for a trench termination structure is shown in FIG. 2B. Termination trenches 40T form concentric rings around the edge of the device. Termination trenches 40T can be filled with either floating conductive material such as polysilicon or floating dielectric material such as silicon dioxide. Also the p-type well regions on either sides of termination trenches 40T can be made either shallower than the trenches or deeper than the trenches.

Figure 4D:
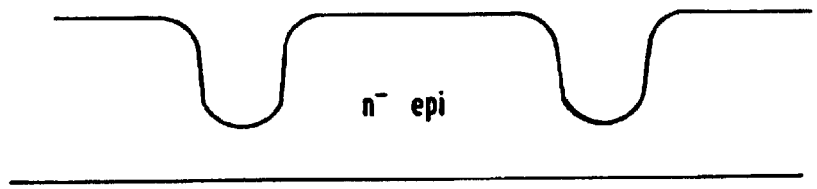

The cell array is formed by the steps shown in FIGS. 4D-4K. First, a plurality of trenches are patterned and etched into the epitaxial layer of the substrate (FIG. 4D). Preferably, as noted above, the trenches are formed using the process described in U.S. application Ser. No. 08/959,197, filed on Oct. 28, 1997, now U.S. Pat. No. 6,103,635, so that the upper and lower corners of each trench will be smoothly rounded. As shown in FIG. 1 and described above, the trenches are patterned to run in only one direction, defined as an open cell structure. After trench formation, a gate oxide layer is formed on the trench walls, as is well known in the semiconductor field. Preferably the gate oxide has a thickness of from about 100 to 800 Å.

Figure 4E:
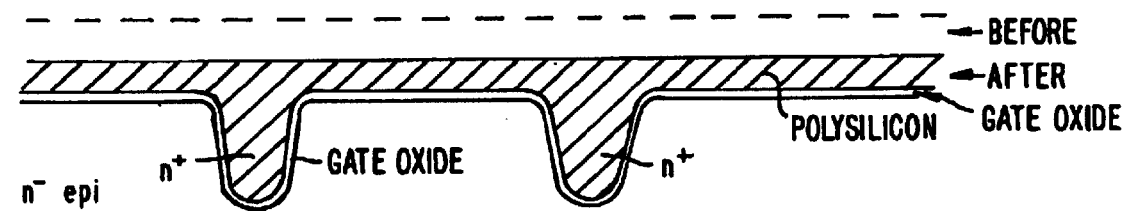

Next, as shown in FIG. 4E, polysilicon is deposited to fill the trench and cover the surface of the substrate, generally to a thickness of from about 1 to 2 μm depending on the trench width (shown by the dotted lines in FIG. 4E). This layer is then planarized by the nature of its thickness relative to the trench width, typically from about 2 to 5 kÅ (indicated by solid lines in FIG. 4E). The polysilicon is then doped to n-type, e.g., by conventional POCL$_3$ doping or by phosphorus implant. The backside of the wafer need not be stripped (as is conventionally done prior to doping the polysilicon to enhance defect gettering) because any further doping of the highly doped substrate would be unlikely to result in any enhancement in defect gettering.

Figure 4F:
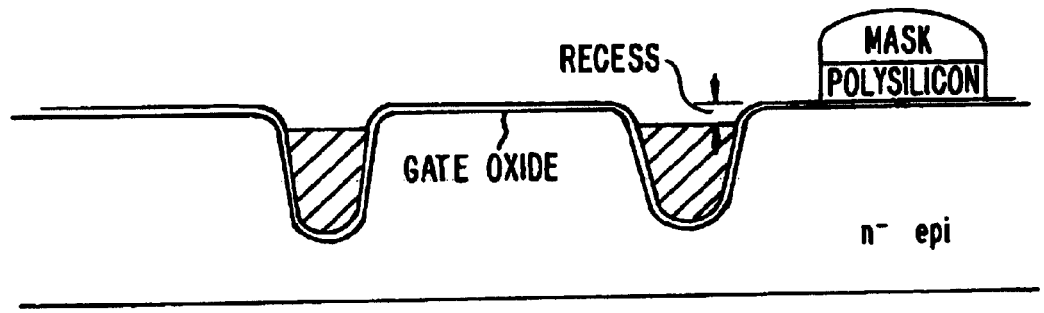

The polysilicon is then patterned with a photoresist mask and etched to remove it from the trench areas, as shown in FIG. 4F. A small recess between the top of the polysilicon in the trench and the substrate surface inherently results when the polysilicon is etched completely to remove all of the polysilicon from the substrate surface. The depth of this recess must be controlled so that it does not exceed the depth of the n+ source junction that will be formed in a later step. To reduce the need to carefully control this aspect of the process, a relatively deep n+ source junction is formed, as will be discussed below.

Figure 4G:
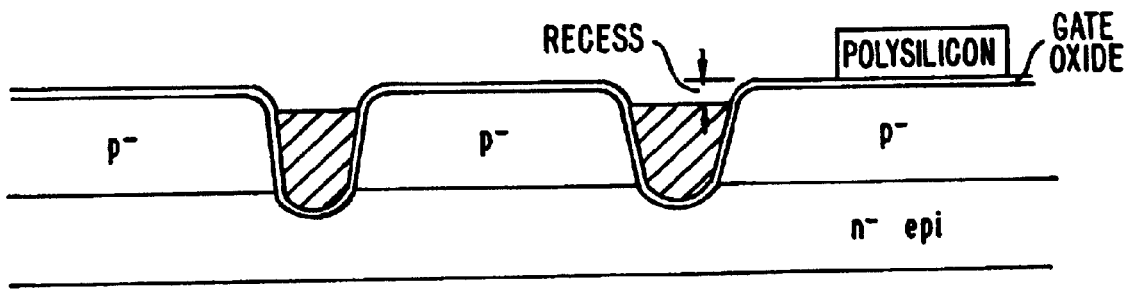

Then, as shown in FIG. 4G, the p− well is formed by implanting the dopant, e.g., a boron implant at an energy of 30 to 100 keV and a dosage of 1E13 to 1E15, and driving it in to a depth of from about 1 to 3 μm using conventional drive in techniques.

Figure 3:
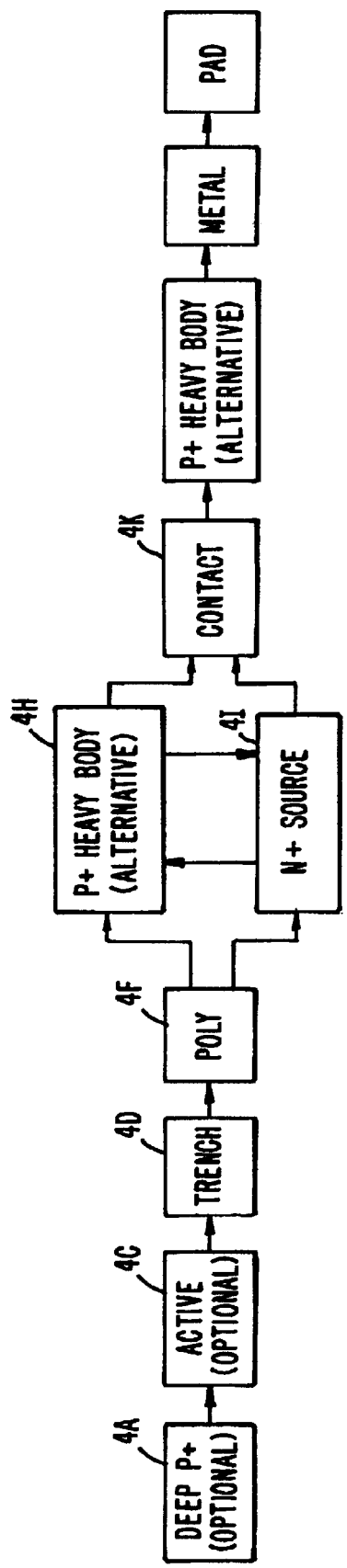
FIG. 3 is a flow diagram showing the photo mask sequence of a preferred process for forming a trench DMOS transistor of FIG. 1.

The next two steps (p+ heavy body formation) can be performed either before formation of the n+ source junction, or afterwards, as indicated by the arrows in FIG. 3. P+ heavy body formation and n+ source junction formation can be performed in either order because they are both resist-masked steps and because there is no diffusion step in between. This advantageously allows significant process flexibility. The p+ heavy body formation steps will be described below as being performed prior to source formation; it will be understood that n+ source formation could be performed first simply by changing the order of the steps discussed below.

Figure 4H:
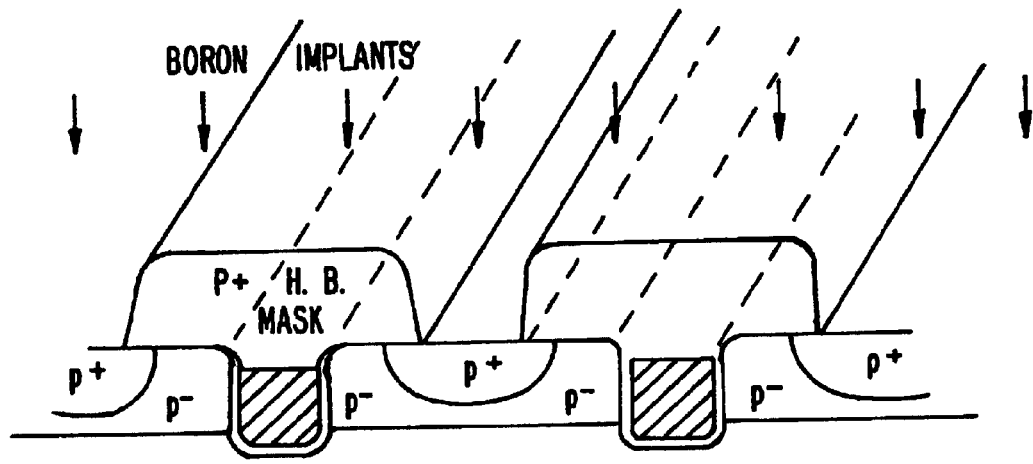
Figure 4K:
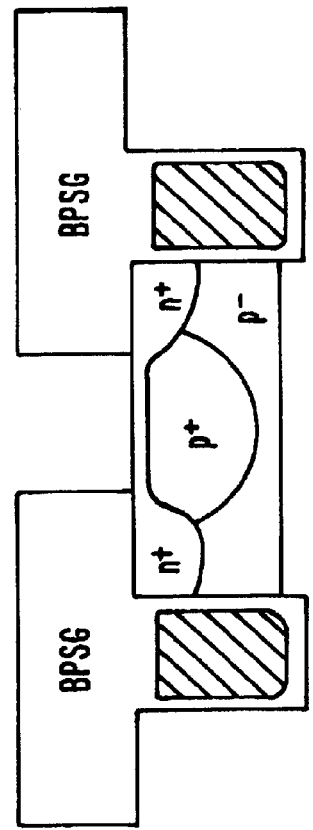
Figure 4J:
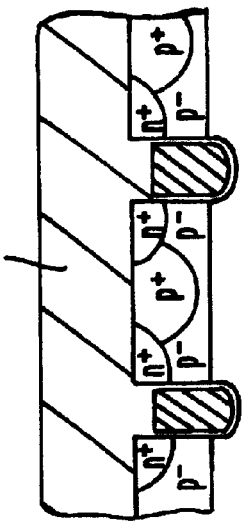
Figure 5:
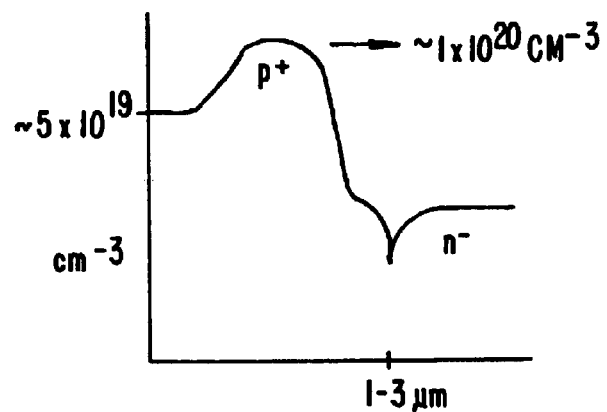
FIGS. 5, 5A, and 5B are spreading resistance profile graphs, reflecting the dopant concentration distribution at different regions of the transistor.

First, a mask is formed over the areas that will not be doped to p+, as shown in FIG. 4H. (It is noted that this masking step is not required if the p+ heavy body is formed later, after the dielectric layer has been applied and patterned for contact holes. (see FIG. 4K, below) so that the dielectric itself provides a mask.) As discussed above, it is preferred that the junction at the interface between the p− well and the p+ heavy body be abrupt. To accomplish this, a double implant of dopant (e.g., boron) is performed. For example, a preferred double implant is a first boron implant at an energy of 150 to 200 keV and a dose of 1E15 to 5E15 cm$^{-2}$, and a second boron implant at an energy of 20 to 40 keV and a dose of 1E14 to 1E15 cm$^{-2}$. The high energy first implant brings the p+ heavy body as deep as possible into the substrate, so that it will not compensate the n+ source junction to be introduced later. The second, lower energy/lower dose implant extends the p+ heavy body from the deep region formed during the first implant up to the substrate surface to provide the p+ contact 18. The resulting p+ heavy body junction is preferably about 0.4 to 1 μm deep at this stage of the process (final junction depth after drive-in is preferably about 0.5 to 1.5 μm deep), and includes a region of high dopant concentration near the interface with the p-well, and a region of relatively low dopant concentration at the contact surface of the p+ heavy body. A preferred concentration distribution is shown in FIG. 5.

It will be appreciated by those skilled in the art that the abrupt junction can be formed in many other ways, e.g., by diffused dopants, by using a continuous dopant source at the surface or by using atoms that diffuse slowly.

Figure 4I:
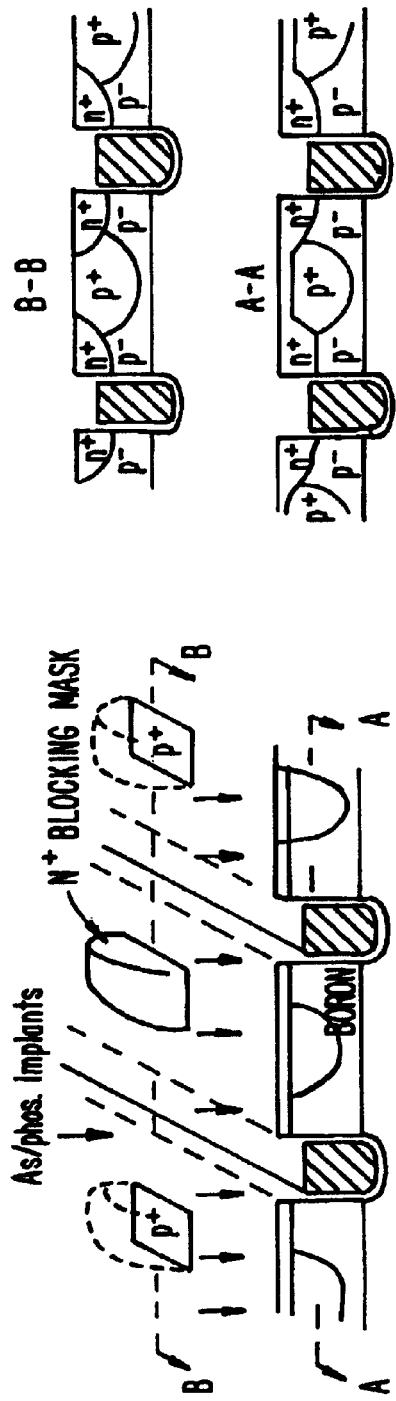

After the formation of the p+ heavy body, a conventional resist strip process is performed to remove the mask, and a new mask is patterned to prepare the substrate for the formation of the n+ source junction. This mask is a n+ blocking mask and is patterned to cover the areas of the substrate surface which are to provide p+ contacts 18 (FIGS. 1 and 1B), as shown in FIG. 4I. This results in the formation of alternating p+ and n+ contacts after n-type doping (see lines A-A and B-B and cross-sectional views A-A and B-B in FIG. 4I, which correspond to FIGS. 1A and 1B).

Figure 5A:
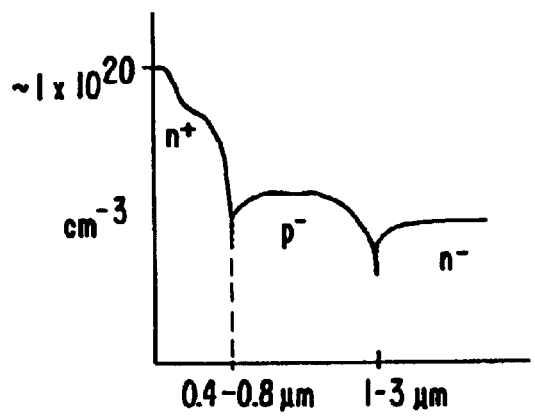
Figure 5B:
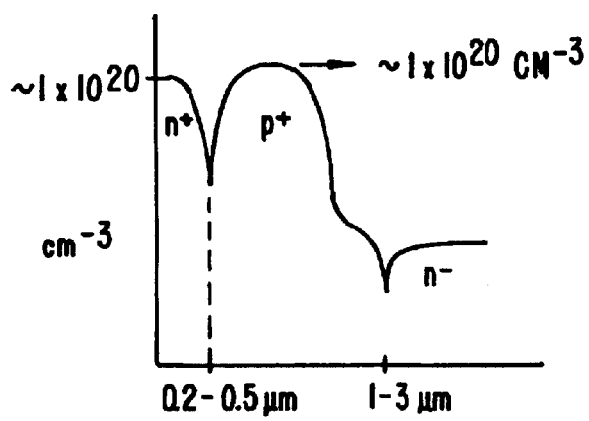

The n+ source regions and n+ contact are then formed using a double implant. For example, a preferred double implant process is a first implant of arsenic at an energy of 80 to 120 keV and a dose of 5E15 to 1E16 cm$^{-2}$ followed by a second implant of phosphorus at an energy of 40 to 70 keV and a dose of 1E15 to 5E15 cm$^{-2}$. The phosphorus implant forms a relatively deep n+ source junction, which allows more process flexibility in the depth of the polysilicon recess, as discussed above. Phosphorus ions will penetrate deeper into the substrate during implant and also during later diffusion steps. Advantageously, the n+ source regions will have a depth of about 0.4 to 0.8 μm after diffusion. The arsenic implant extends the n+ source to the substrate surface, and also forms the n+ contacts 16 (see FIGS. 1 and 1A) by compensating (converting) the p-type surface of the p+ heavy body to n-type in the desired contact area. The preferred sheet resistance profiles for the n+ source along the edge of the trench, and the n+ contact are shown in FIGS. 5A and 5B, respectively.

Thus, the alternating p+ and n+ contacts 18, 16, shown in FIG. 1 are formed by patterning the substrate with appropriate masks and doping with the first p+ implant and the second n+ implant, respectively, as described above. This manner of forming the alternating contacts advantageously allows an open cell array having a smaller cell pitch than is typical for such arrays and thus a higher cell density and lower Rds$_{on}$.

Next, a conventional n+ drive is performed to activate the dopants. A short cycle is used, preferably 10 min at 900° C., so that activation occurs without excessive diffusion.

A dielectric material, e.g., borophosphate silicate glass (BPSG), is then deposited over the entire substrate surface and flowed in a conventional manner (FIG. 4J), after which the dielectric is patterned and etched (FIG. 4K) to define electrical contact openings over the n+ and p+ contacts 16, 18.

As noted above, the p+ heavy body implant steps can be performed at this point, if desired (rather than prior to n+ source formation), eliminating the need for a mask and thus reducing cost and process time.

Next, the dielectric is reflowed in an inert gas, e.g., a nitrogen purge. If the p+ body has been implanted immediately prior, this step is required to activate the p+ dopant. If the p+ body was implanted earlier, prior to the n+ drive, this step can be omitted if the dielectric surface is sufficiently smooth-edged around the contact openings.

The cell array is then completed by conventional metalization, passivation deposition and alloy steps, as is well known in the semiconductor field.

Other embodiments are within the claims. For example, while the description above is of an n-channel transistor, the processes of the invention could also be used to form a p-channel transistor. To accomplish this, "p" and "n" would simply be reversed in the above description, i.e., where "p" doping is specified above the region would be "if" doped instead, and vice versa.

What is claimed is:

1. A field effect transistor comprising:
    a semiconductor substrate having dopants of a first conductivity type;
    a trench extending a predetermined depth into the semiconductor substrate, wherein a gate structure is formed inside the trench;
    a doped well having dopants of a second conductivity type opposite to the first conductivity type and extending into the semiconductor substrate to form a well junction at a first depth;
    a doped source region having dopants of the first conductivity type and extending into the semiconductor substrate to form a source junction at a second depth; and
    a doped heavy body region having dopants of the second conductivity type and extending into the doped well to form a heavy body junction at a depth that is deeper than the source junction and shallower than the trench,
    wherein the heavy body region forms an abrupt junction at the interface between the heavy body region having dopants of the second conductivity type and the doped well having dopants of the second conductivity type, such that, when voltage is applied to the transistor, a peak electric filed occurs near the area of the interface.

2. The field effect transistor of claim 1 wherein a location of the abrupt junction relative to the well junction is adjusted so that, when voltage is applied to the transistor, a peak electric field is spaced away from the trench in the semiconductor.

3. The field effect transistor of claim 1 wherein the doped well has a substantially flat bottom.

4. The field effect transistor of claim 1 wherein the trench has rounded top corners.

5. The field effect transistor of claim 1 wherein the trench has rounded bottom corners.

6. The field effect transistor of claim 1 wherein the trench has rounded top and bottom corners.

7. The field effect transistor of claim 1 wherein the heavy body comprises a heavily doped region formed by implanting dopants of the second conductivity type at an approximate location of the abrupt junction.

8. The field effect transistor of claim 1 wherein the trench is lined with a dielectric material and substantially filled with conductive material, wherein the conductive material substantially filling the trench is recessed relative to the surface of the substrate.

9. The field effect transistor of claim 1 wherein the substrate comprises a first highly doped region and a second doped region disposed above said first highly doped region, the second doped region having a lower doping concentration relative to the first highly doped region.

10. The field effect transistor of claim 9 further comprising a termination structure surrounding the transistor.

11. The field effect transistor of claim 10 wherein the termination structure comprises a doped region having dopants of the second conductivity type extending into the second doped region of the substrate to form a PN junction between the termination doped region and the second doped region of the substrate.

12. The field effect transistor of claim 10 wherein the termination structure comprises a trench.

13. The field effect transistor of claim 10 wherein the termination structure comprises a plurality of concentric trenches surrounding the transistor.

14. The field effect transistor of claim 12 wherein the termination trench extends to substantially the same depth as the transistor trench.

15. The field effect transistor of claim 9 wherein the second doped region of the substrate has an initial thickness of less than 10 μm.

16. The field effect transistor of claim 9 wherein the doped well extends into the second doped region of the substrate such that the resulting thickness of the second doped region of the substrate is less than 3 μm.

17. The field effect transistor of claim 9 wherein the doped well extends into the second doped region of the substrate such that the resulting thickness of the second doped region of the substrate is approximately 1 μm.

18. The field effect transistor of claim 1 wherein the depth of the doped well ranges from approximately 1 μm to 3 μm.

19. The field effect transistor of claim 1 wherein the depth of the doped heavy body ranges from approximately 0.4 μm to 1.5 μm.

20. The field effect transistor of claim 1 wherein a distance between a bottom of the doped heavy body to the doped well junction ranges from approximately 0.5 μm to 1.5 μm.

21. The field effect transistor of claim 1 wherein a distance between a bottom of the doped heavy body to the doped well junction is less than approximately 0.5 μm.

22. A field effect transistor comprising:
a semiconductor substrate having dopants of a first conductivity type;
a plurality of gate-forming trenches arranged substantially parallel to each other, each trench extending to a first depth into said substrate, the space between adjacent trenches defining a contact area;
a doped well having dopants of a second conductivity type opposite to the first conductivity type and extending into the semiconductor substrate to form a well junction with the substrate;
a doped source region having dopants of the first conductivity type forming a source junction inside the doped well;
a heavy body having dopants of the second conductivity type and extending into the doped well to a second depth that is deeper than the source junction; and
heavy body contact regions defined at the surface of the semiconductor substrate along the length of the contact area,
wherein the heavy body forms an abrupt junction at the interface between the heavy body region having dopants of the second conductivity type and the doped well having dopants of the second conductivity type, such that, when voltage is applied to the transistor, a peak electric filed occurs near the area of the interface.

23. The field effect transistor of claim 22, wherein said doped well has a substantially flat bottom.

24. The field effect transistor of claim 22 wherein a location of the abrupt junction relative to the well junction at the second depth is adjusted so that, when voltage is applied to the transistor, a peak electric field is spaced away from the plurality of gate-forming trenches.

25. The field effect transistor of claim 22 wherein said doped well has a depth less than the first depth of the gate-forming trenches.

26. The field effect transistor of claim 22 wherein each said gate-forming trench has rounded top corners.

27. The field effect transistor of claim 22 wherein each said gate-forming trench has rounded bottom corners.

28. The field effect transistor of claim 22 wherein each said gate-forming trench has rounded top and bottom corners.

29. The field effect transistor of claim 22 further comprising a deep doped region having dopants of the second conductivity type, the deep doped region extending into the substrate to a depth greater than the first depth of the plurality of gate-forming trenches.

30. The field effect transistor of claim 29 wherein the deep doped region forms a PN junction diode with the substrate.

31. The field effect transistor of claim 29 wherein the deep doped region forms a field termination structure surrounding the periphery of the plurality of gate-forming trenches.

32. The field effect transistor of claim 31 further comprising:
a layer of dielectric material formed over the deep doped region; and
a layer of conductive material formed on top of the layer of dielectric material.

33. The field effect transistor of claim 22 further comprising a field termination structure comprising a trench substantially surrounding the plurality of gate-forming trenches.

34. The field effect transistor of claim 33 wherein said field termination structure comprises a plurality of concentrically arranged trenches.

35. The field effect transistor of claim 22 wherein the heavy body forms a continuous doped region along substantially the entire length of said contact area.

36. The field effect transistor of claim 22 wherein said doped source region extends along the length of the trench.

37. The field effect transistor of claim 36 further comprising a source contact region defined at the surface of the semiconductor substrate and configured to contact the doped source region.

38. The field effect transistor of claim 36 further comprising a plurality of source contact regions disposed along the length of the contact area in an alternating fashion with the plurality of heavy body contact regions.

39. The field effect transistor of claim 22 wherein between a pair of adjacent trenches a plurality of doped source regions are positioned on opposite sides of each trench, and wherein the heavy body is bounded by the pair of adjacent trenches and the doped source regions.

40. The field effect transistor of claim 22 wherein between a pair of adjacent trenches, the heavy body extends continuously parallel to the longitudinal axis of the trenches.

41. The field effect transistor of claim 22 further comprising:
   a layer of dielectric material lining inside walls of each of said plurality of gate-forming trenches; and
   a layer of conductive material substantially filling the gate-forming trenches.

42. The field effect transistor of claim 41 wherein the layer of conductive material comprises polysilicon.

43. The field effect transistor of claim 41 wherein the top surface of the layer of conductive material substantially filling the gate-forming trenches is recessed relative to the top surface of the semiconductor substrate.

44. The field effect transistor of claim 22 wherein the substrate comprises a first highly doped region and a second doped region disposed above said first highly doped region, the second doped region having a lower doping concentration relative to the first highly doped region.

45. The field effect transistor of claim 44 wherein the second doped region of the substrate has an initial thickness of less than 10 μm.

46. The field effect transistor of claim 44 wherein the doped well extends into the second doped region of the substrate such that the resulting thickness of the second doped region of the substrate is less than 3 μm.

47. The field effect transistor of claim 44 wherein the doped well extends into the second doped region of the substrate such that the resulting thickness of the second doped region of the substrate is approximately 1 μm.

48. The field effect transistor of claim 22 wherein the depth of the doped well ranges from approximately 1 μm to 3 μm.

49. The field effect transistor of claim 22 wherein the depth of the doped heavy body ranges from approximately 0.4 μm to 1.5 μm.

50. The field effect transistor of claim 22 wherein a distance between a bottom of the doped heavy body to the doped well junction ranges from approximately 0.5 μm to 1.5 μm.

51. The field effect transistor of claim 22 wherein a distance between a bottom of the doped heavy body to the doped well junction is less than approximately 0.5 μm.

* * * * *